US009853058B2

(12) United States Patent
Asakawa

(10) Patent No.: US 9,853,058 B2
(45) Date of Patent: Dec. 26, 2017

(54) THIN FILM TRANSISTOR ARRAY PANEL AND DISPLAY DEVICE INCLUDING THE SAME

(71) Applicant: SAMSUNG DISPLAY CO., LTD., Yongin-si, Gyeonggi-do (KR)

(72) Inventor: Yukinori Asakawa, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/060,307

(22) Filed: Mar. 3, 2016

(65) Prior Publication Data
US 2016/0284738 A1 Sep. 29, 2016

(30) Foreign Application Priority Data

Mar. 25, 2015 (KR) ........................ 10-2015-0041812

(51) Int. Cl.
H01L 29/04 (2006.01)
H01L 31/036 (2006.01)
H01L 31/0376 (2006.01)
H01L 31/20 (2006.01)
H01L 27/12 (2006.01)
(Continued)

(52) U.S. Cl.
CPC ........ *H01L 27/1218* (2013.01); *G02F 1/1333* (2013.01); *H01L 29/78603* (2013.01); *H01L 29/78669* (2013.01); *G02F 1/136209* (2013.01); *G02F 2001/133368* (2013.01); *G02F 2001/136222* (2013.01)

(58) Field of Classification Search
CPC ........... H01L 27/1218; H01L 29/78669; H01L 29/78603; G02F 1/136209; G02F 1/1368; G02F 2001/136222
USPC ...................................................... 257/59, 72
See application file for complete search history.

(56) References Cited

U.S. PATENT DOCUMENTS

2006/0066797 A1* 3/2006 Baek ................. G02F 1/134336
349/139
2015/0009460 A1* 1/2015 Jang .................. G02F 1/136209
349/106

FOREIGN PATENT DOCUMENTS

JP 53-49068 5/1978
JP 3-101228 A 4/1991
(Continued)

OTHER PUBLICATIONS

Shuo-Cheng Wang et al., "Fabricating Thin-Film Transistors on Plastic Substrates Using Spin Etching and Device Transfer," Journal of the Electrochemical Society, Feb. 1, 2005, pp. G227-G233, 152 (3), The Electrochemical Society, Inc.
(Continued)

Primary Examiner — Thien F Tran
(74) Attorney, Agent, or Firm — Innovation Counsel LLP

(57) ABSTRACT

Embodiments of the present invention relate to a thin film transistor array panel and a display device including the same. An exemplary embodiment of the present invention provides a thin film transistor array panel and a display device including the same, including: an insulation substrate including an upper surface and a lower surface; a light blocking member disposed on or facing the upper surface of the insulation substrate and defining a plurality of openings; and a thin film transistor disposed on the upper surface of the insulation substrate. The insulation substrate may include a plurality of recesses formed in the opening in the lower surface of the insulation substrate, each recess positioned to correspond to one of the openings.

19 Claims, 7 Drawing Sheets

(51) Int. Cl.
*H01L 29/786* (2006.01)
*G02F 1/1333* (2006.01)
*G02F 1/1362* (2006.01)

(56) References Cited

FOREIGN PATENT DOCUMENTS

| | | |
|---|---|---|
| JP | 5-202206 A | 8/1993 |
| JP | 5-301981 A | 11/1993 |
| JP | 6-291097 A | 10/1994 |
| JP | 2002-138155 A | 5/2002 |
| JP | 2014-41904 A | 3/2014 |
| KR | 10-2008-0066149 A | 7/2008 |
| KR | 10-1092967 B1 | 12/2011 |
| KR | 10-1107180 B1 | 1/2012 |
| KR | 10-1332269 B1 | 11/2013 |

OTHER PUBLICATIONS

Youngsuk Jung et al., "Structural and Compositional Effects on Thermal Expansion Behavior in Polyimide Substrates of Varying Thicknesses," European Polymer Journal, Nov. 2013, pp. 3642-3650, 49, Elsevier Ltd.
Satoshi Inoue, "Surface-Free Technology by Laser Annealing (SUFTLA) and its Application to Poly-Si TFT-LCDs on Plastic Film with Integrated Drivers," IEEE Transactions on Electron Devices, Aug. 2002, pp. 1353-1360, vol. 49, No. 8, IEEE.
Toshihiro Yamamoto et al., "Transfer Technology for Fabrication of Flexible OTFT Backplane," Industry Applications Society Annual Meeting (IAS), Oct. 2011, 5 pages, IEEE.

\* cited by examiner

THIN FILM TRANSISTOR ARRAY PANEL AND DISPLAY DEVICE INCLUDING THE SAME

CROSS-REFERENCE TO RELATED APPLICATION

This application claims priority to, and the benefit of, Korean Patent Application No. 10-2015-0041812 filed in the Korean Intellectual Property Office on Mar. 25, 2015, the entire contents of which are incorporated herein by reference.

BACKGROUND (a) Field of the Invention

Embodiments of the present invention relate generally to flat panel displays. More specifically, embodiments of the present invention relate to a thin film transistor array panel and a display device including the same.

(b) Description of the Related Art

Display devices that are widely used currently include a liquid crystal display, an organic light emitting diode display, an electrophoretic display, and the like. Such display devices include a thin film transistor array panel on which a plurality of pixels and a plurality of driving signal lines are formed.

Recently, demand for a light and slim display device has steadily increased, and accordingly, a thin substrate such as a plastic flexible substrate having a thickness equal to or less than 2 mm has been developed and used. However, unlike a glass substrate, a plastic substrate has characteristics that cause phase retardation to increase, such that visibility may be reduced. Accordingly, a thin film transistor array panel including the plastic substrate and a display device including the thin film transistor array panel may cause deterioration of image quality.

The above information disclosed in this Background section is only to enhance the understanding of the background of the invention, and therefore it may contain information that does not form the prior art that is already known in this country to a person of ordinary skill in the art.

SUMMARY

Embodiments of the present invention provide a thin film transistor array panel and a display device including the same, that may improve image quality by increasing visibility.

An exemplary embodiment of the present invention provides a thin film transistor array panel, including: an insulation substrate including an upper surface and a lower surface; a light blocking member disposed on or facing the upper surface of the insulation substrate and defining a plurality of openings; and a thin film transistor disposed on the upper surface of the insulation substrate. The insulation substrate may include a plurality of recesses formed in the lower surface of the insulation substrate, each recess positioned to correspond to one of the openings.

Each recess may include opposing lateral surfaces and a bottom surface extending therebetween.

At least one lateral surface may be substantially perpendicular to its corresponding bottom surface.

At least one lateral surface may form an angle of about 105° to 150° with respect to its corresponding bottom surface.

A cross-sectional shape of each recess may be an arc, sine wave, semicircular, or semi-elliptical shape.

The insulation substrate may comprise at least one of polyimide, polyamide, and polycarbonate.

A thickness of the insulation substrate may be from about 2 μm to about 50 μm.

A height of each recess may be equal to or less than ⅔ of the thickness of the insulation substrate.

The thin film transistor array panel may further include a passivation film formed below the lower surface of the insulation substrate.

The thin film transistor may include a gate electrode; a gate insulating layer formed on the gate electrode; a semiconductor layer formed on the gate insulating layer; a pair of ohmic contact members formed on the semiconductor; and a source electrode and a drain electrode formed on the ohmic contact members.

Another embodiment of the present invention provides a display device, including: an insulation substrate including an upper surface and a lower surface; a light blocking member disposed on or facing the upper surface of the insulation substrate and defining a plurality of openings; a thin film transistor disposed on the upper surface of the insulation substrate; and a plurality of color filters formed in the openings. The insulation substrate includes a plurality of recesses formed in the lower surface of the insulation substrate, each recess positioned to correspond to one of the openings.

Each recess may include opposing lateral surfaces and a bottom surface extending therebetween.

At least one lateral surface may be substantially perpendicular to its corresponding bottom surface.

At least one lateral surface may form an angle of about 105° to 150° with respect to its corresponding bottom surface.

A cross-sectional shape of each recess may be an arc, sine wave, semicircular, or semi-elliptical shape.

The insulation substrate may comprise at least one of polyimide, polyamide, and polycarbonate.

A thickness of the insulation substrate may be from about 2 μm to about 50 μm.

A height of each recess may be equal to or less than ⅔ of the thickness of the insulation substrate.

The display device may further include a passivation film formed below the lower surface of the insulation substrate.

According to the exemplary embodiments of the present invention, a thin film transistor array panel and a display device including the same may exhibit increased visibility and thus improved image quality by patterning an area of the display substrate corresponding to a pixel area.

DETAILED DESCRIPTION OF THE EMBODIMENTS

Figure 1:
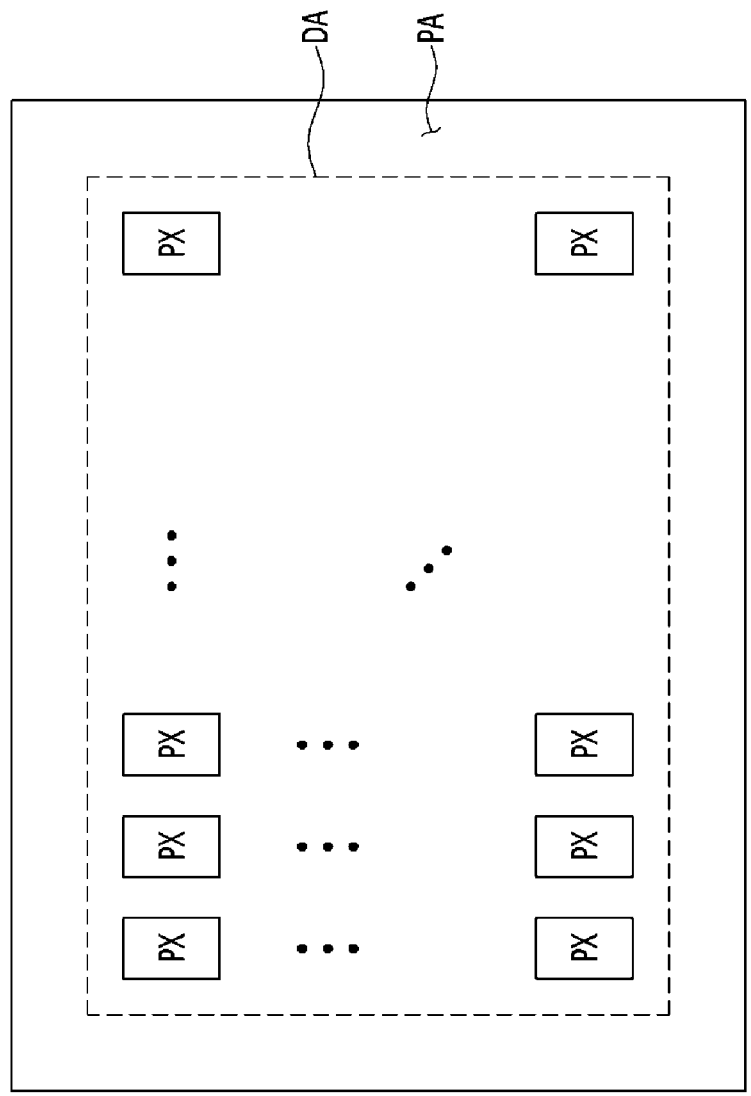
FIG. 1 is a layout view of a thin film transistor array panel included in a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. The various Figures are thus not to scale. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

All numerical values are approximate, and may vary. All examples of specific materials and compositions are to be taken as nonlimiting and exemplary only. Other suitable materials and compositions may be used instead.

First, a thin film transistor array panel of a display device according to an exemplary embodiment of the present invention will be described with reference to FIGS. 1 and 2. FIG. 1 is a layout view of a thin film transistor array panel included in a display device according to an exemplary embodiment of the present invention, and FIG. 2 is a layout view of pixels of a thin film transistor array panel included in a display device according to an exemplary embodiment of the present invention.

Figure 2:
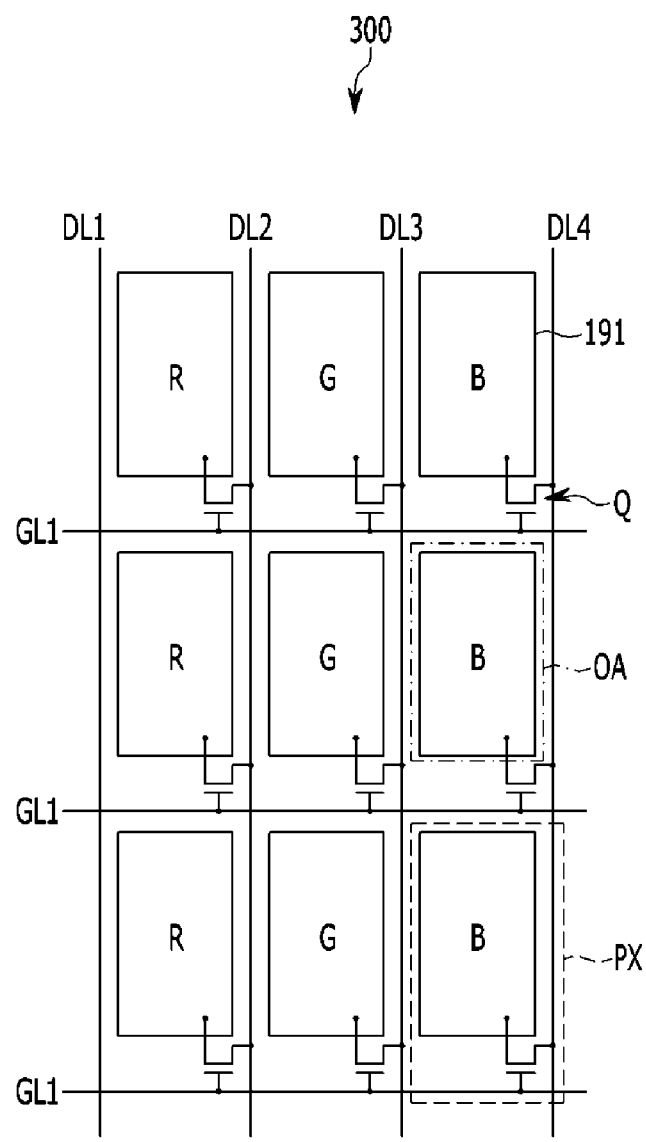
FIG. 2 is a layout view of pixels of a thin film transistor array panel included in a display device according to an exemplary embodiment of the present invention.

First, referring to FIGS. 1 and 2, a display device according to an exemplary embodiment of the present invention includes a thin film transistor array panel 300. The thin film transistor array panel 300 may be included in various flat panel displays (FPDs), such as a liquid crystal display (LCD), an organic light emitting diode display (OLED), an electrowetting display (EWD), and the like.

In this case, the thin film transistor array panel 300 according to the exemplary embodiment of the present invention may be used in a liquid crystal display in which a roof layer is formed on one substrate and which is manufactured by injecting a liquid crystal layer in a microcavity formed between a substrate and the roof layer.

The thin film transistor array panel 300 includes a display area DA displaying an image, and a peripheral area PA disposed around the display area DA.

A plurality of signal lines including a plurality of gate lines (GL1, GL2, GL3, and so on) and a plurality of data lines (DL1, DL2, DL3, and so on), and a plurality of pixel areas PX connected to the signal lines, are disposed in the display area DA.

The data lines (DL1, DL2, DL3, and so on) transmit data voltages for image signals, and they may substantially extend in a column direction and may be substantially parallel to each other. The gate lines (GL1, GL2, GL3, and so on) transmit gate signals, and they may substantially extend in a row direction and may be substantially parallel to each other.

The plurality of pixel areas PX may be substantially arranged in a matrix form. One pixel area PX may include at least one switching element (not shown) connected to at least one data line (DL1, DL2, DL3, and so on) and at least one gate line (GL1, GL2, GL3, and so on), and at least one pixel electrode 191 connected to the at least one switching element. The switching element may include at least one thin film transistor integrated in the thin film transistor array panel 300. The switching element may be controlled by the gate signals transmitted through the gate lines (GL1, GL2, GL3, and so on), such that the data voltages transmitted through the data lines (DL1, DL2, DL3, and so on) may be transmitted to the pixel electrode 191. The pixel area PX may display a corresponding image depending on the data voltage applied to the pixel electrode 191.

The pixel area PX of the thin film transistor array panel 300 may be divided into a plurality of openings OA that transmit light, and a light blocking area BA (see FIGS. 4-7) that prevents light leakage between the openings OA. In this case, the thin film transistor array panel 300 may include a light blocking member (not shown) disposed to differentiate the opening OA and the light blocking area BA, that is, to form the light blocking area BA. The light blocking member is referred to as a black matrix, and it prevents light leakage between pixels. The signal lines such as the gate lines (GL1, GL2, GL3, and so on), the data lines (DL1, DL2, DL3, and so on) and the like, and at least some of the switching elements disposed in the pixel area PX, may be covered by the light blocking member of the pixel area PX.

Next, further details of the thin film transistor array panel of the display device according to an exemplary embodiment of the present invention will be described with reference to FIGS. 3 to 7 and the above-described drawings.

Figure 3:
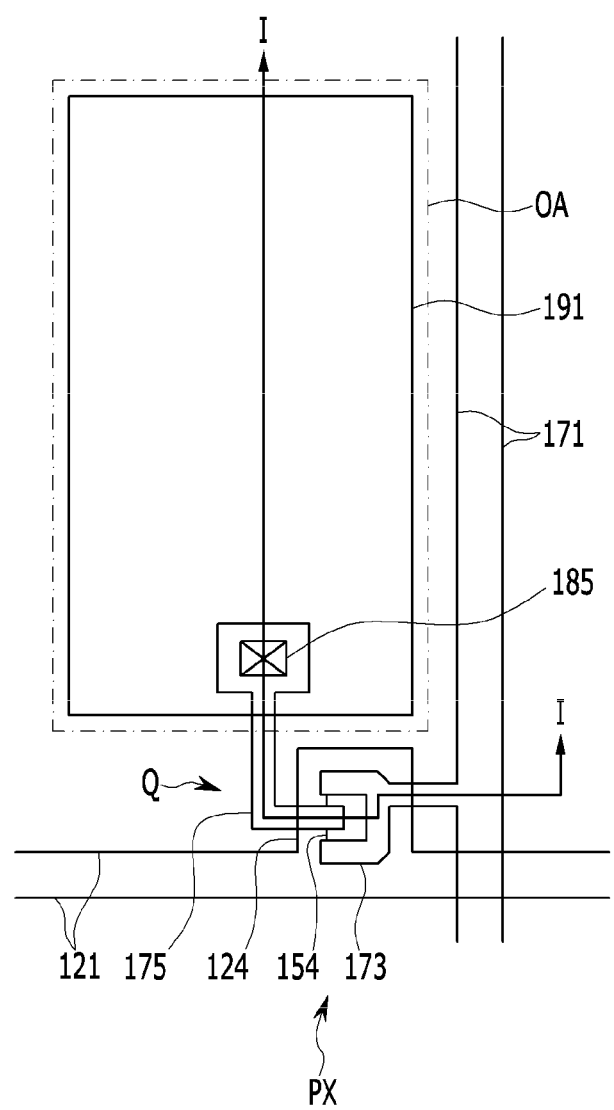
FIG. 3 is a plan view illustrating a structure of a pixel of the thin film transistor array panel according to an exemplary embodiment of the present invention.

FIG. 3 is a plan view illustrating a structure of a pixel of the thin film transistor array panel according to an exemplary embodiment of the present invention, and FIGS. 4 to 7 are cross-sectional views of different embodiments of the thin film transistor array panel of FIG. 3 taken along line I-I.

Figure 4:
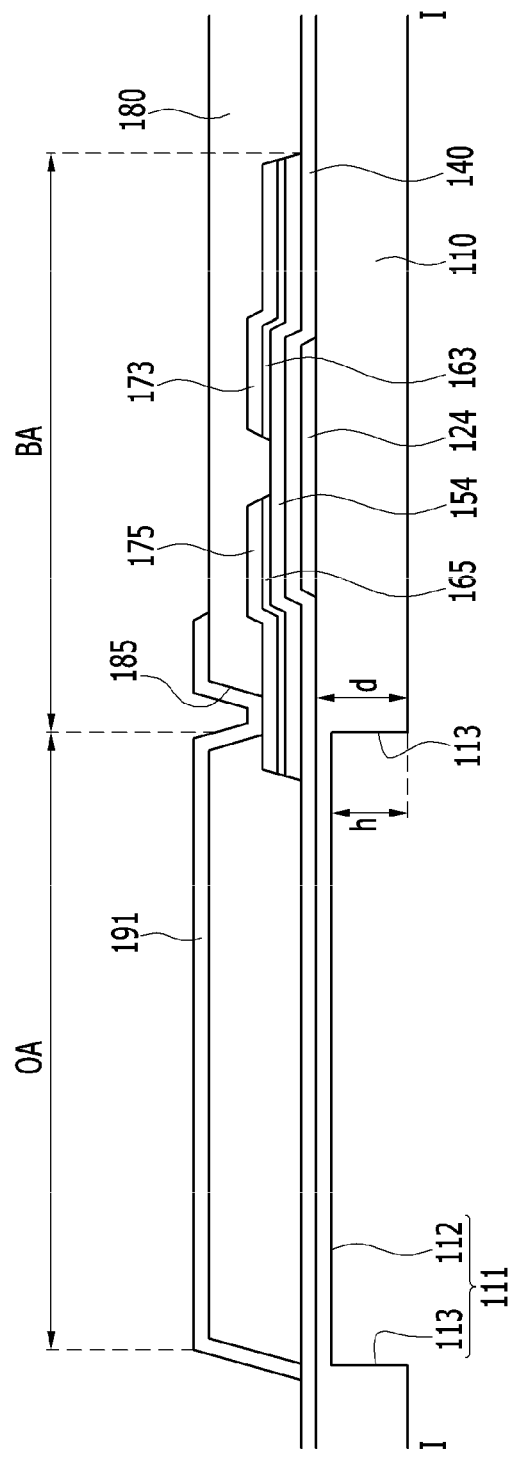
FIG. 4 is a cross-sectional view of an embodiment of the thin film transistor array panel of FIG. 3 taken along line I-I.

Referring to FIGS. 3 and 4, the thin film transistor array panel 300 of the display device according to the exemplary embodiment of the present invention may include an insulation substrate 110 that is made of transparent plastic or the like, and that includes an upper surface and a lower surface.

The insulation substrate 110 may be formed of a polyimide, polyamide, or polycarbonate. The polyimide, the polyamide, or the polycarbonate has excellent mechanical strength and a maximum process feasible temperature of about 450° C. to secure excellent heat resistance as compared to other polymer materials. Accordingly, the insulation substrate 110 formed of polyimide, polyamide, or polycarbonate may stably function as a substrate even though high temperature heat is applied thereto while forming the thin film transistor.

A thickness (d) of the insulation substrate 110 may be equal to or less than about 50 μm for slimness of the thin film transistor array panel 300 and the display device including the thin film transistor array panel 300, and it may be equal to or greater than about 2 μm so that a structure stacked on the insulation substrate 110 may be adequately supported.

The lower surface of the insulation substrate 110 may include at least one concavity 111 or recess formed to face (i.e. formed or positioned within) the opening OA that light of the pixel transmits through.

Generally, the degree of transparency of the insulation substrate 110 is proportional to the thickness (d) of the substrate, and phase retardation thereof is inversely proportional to the thickness (d) of the substrate.

Since the thin film transistor array panel 300 includes the concavity(s) 111 positioned to correspond to the opening OA that passes light therethrough, the thickness of the insulation substrate 110 is reduced in the area of the opening OA.

That is, since a thickness of the insulation substrate 110 in an area that is viewed by a user is reduced, transparency of the insulation substrate 110 may increase and phase retardation may decrease, thus improving image quality of the display. Although the concavity 111 is shown as being formed only in the substrate 110, it may also be formed in other layers that have been deposited on substrate 110. That is, concavity 111 may not only extend into substrate 110, but may also extend into or through other layers formed on substrate 110. Embodiments of the invention contemplate concavities 111 that extend into or through any number of layers in addition to substrate 110.

In this case, the concavity 111 may be formed in the lower surface of the insulation substrate 110 corresponding to the opening OA, by various methods. For example, the concavity 111 may be formed by a chemical etching method using a hydrazine-based alkali solution, or it may be formed by processing etching gas into plasma and dry-etching the insulation substrate 110. Further, the concavity 111 may be formed by irradiating a laser beam on the insulation substrate, and it may also be formed by an imprinting method. Any method of forming an opening, cavity, recess, or cutout is contemplated.

The concavity 111 may include lateral surfaces 113 and a bottom surface 112 extending between the lateral surfaces 113. Referring to FIG. 4, each lateral surface 113 of the concavity 111 may be substantially perpendicular to the bottom surface 112 so that a cross-section of the concavity 111 may be rectangular.

In this case, as a difference between a height (h) of the concavity 111 and the thickness (d) of the insulation substrate is smaller, transparency of the insulation substrate 110 is improved. Preferably, the height (h) of the concavity 111 may be equal to or less than ⅔ of the thickness (d) of the insulation substrate in order to ensure adequate support for the various structures stacked on the insulation substrate 110.

Figure 5:
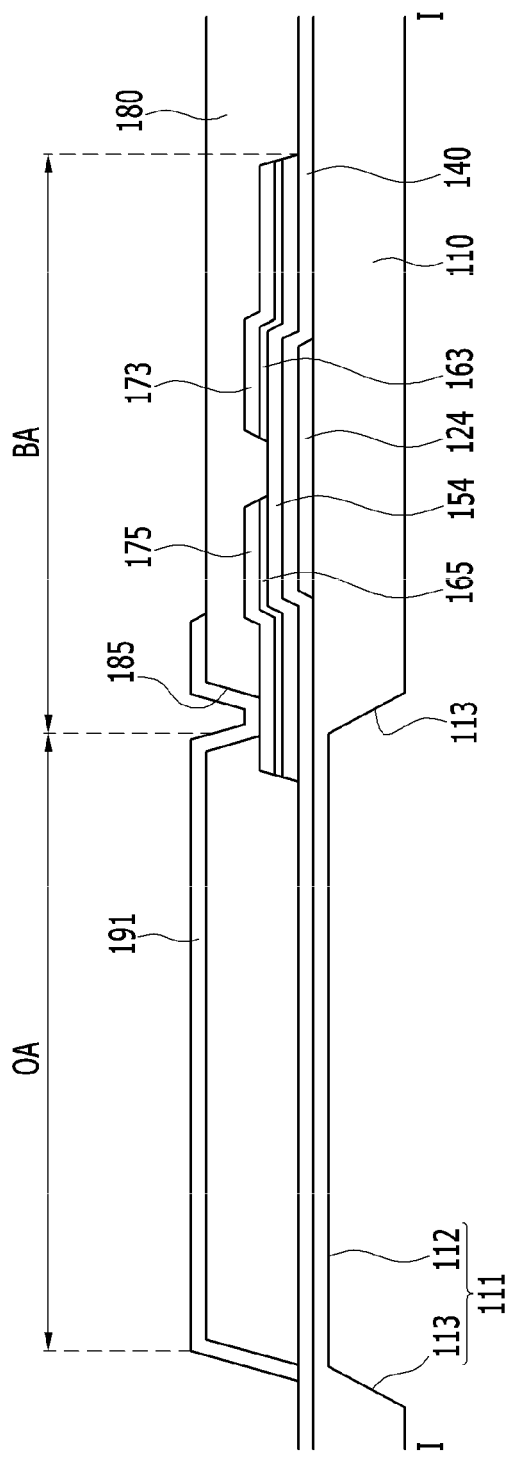
FIG. 5 is a cross-sectional view of another embodiment of the thin film transistor array panel of FIG. 3 taken along line I-I.

However, a cross-sectional shape of the concavity 111 is not limited thereto, and it may be varied according to various exemplary embodiments. Referring to FIG. 5, the lateral surface 113 of concavity 111 may form an angle of about 105° to 150° with respect to the bottom surface 112, so that a cross-section of the concavity 111 may be trapezoidal. Any numerical value is contemplated for this angle.

According to the present exemplary embodiment, the lateral surfaces 113 of the concavity 111 are not necessarily coated by a separate coating process.

Figure 6:
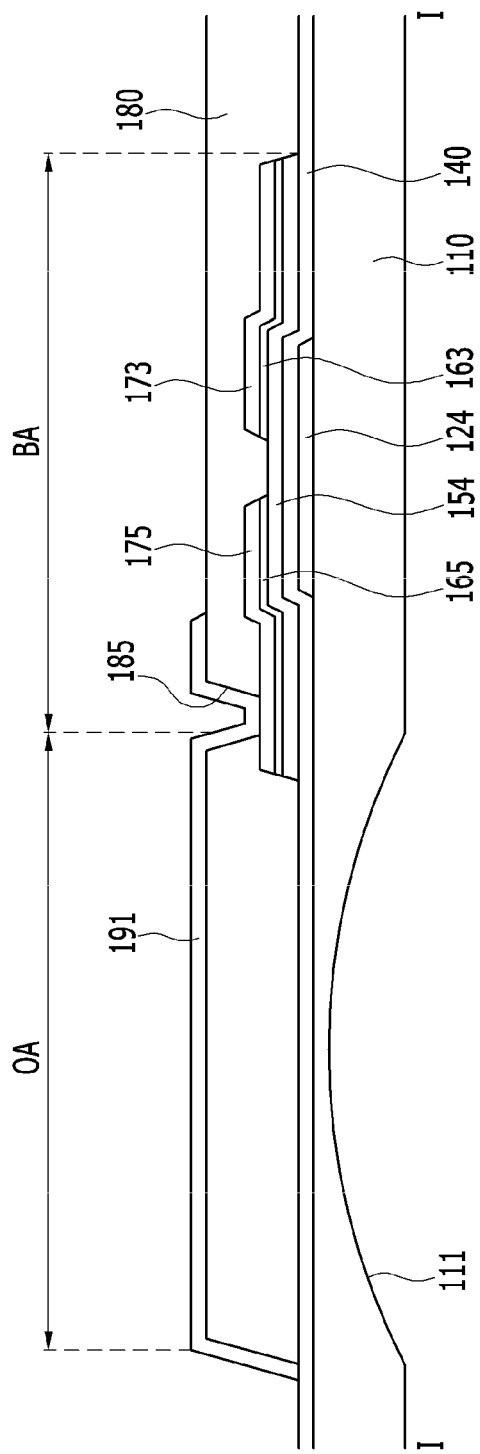
FIG. 6 is a cross-sectional view of a further embodiment of the thin film transistor array panel of FIG. 3 taken along line I-I.
Figure 7:
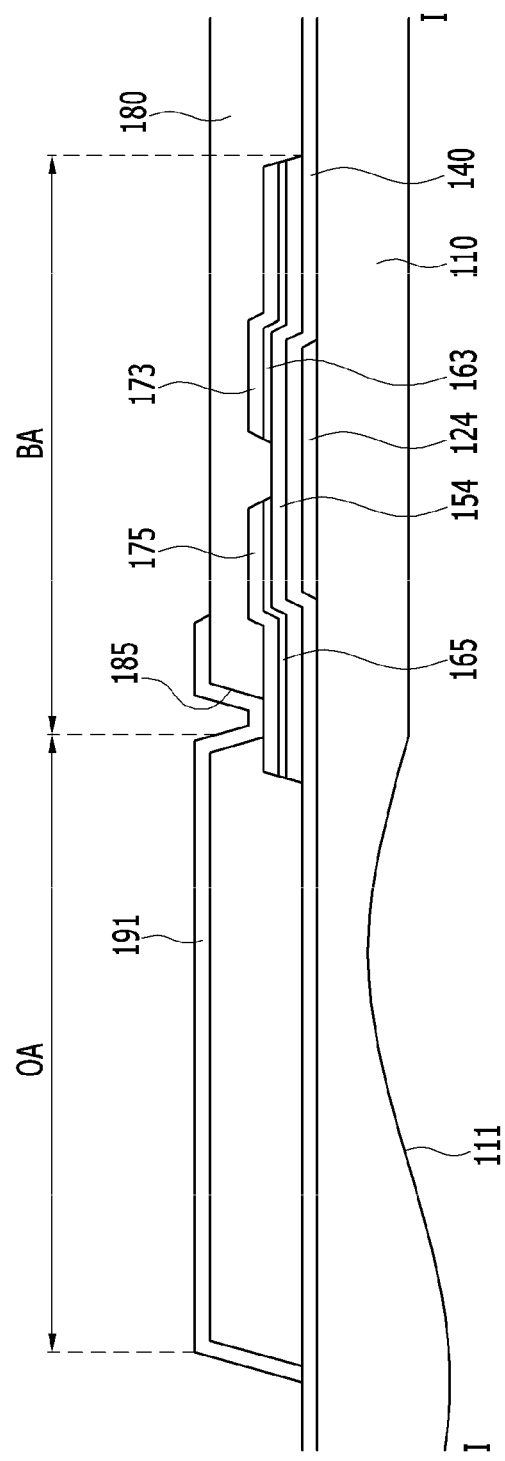
FIG. 7 is a cross-sectional view of a still further embodiment of the thin film transistor array panel of FIG. 3 taken along line I-I.

Referring to FIGS. 6 and 7, a cross-section of the concavity 111 may be an arc, sine wave, semicircular, or semi-elliptical shape. Any arcuate or nonlinear profile is contemplated.

A passivation film (not shown) may be disposed below the concavity 111. The passivation film is disposed in a lower portion of the insulation substrate 110 to protect the thin film transistor array panel 300 and the display device including the thin film transistor array panel. Further, the passivation film may prevent the concavity 111 of the insulation substrate 110 from being visible to a user.

Since the passivation film is formed as a multi-layered structure, a mechanical strength of the thin film transistor array panel 300 may increase, and the passivation film may include a moisture prevention layer (not shown) for preventing penetration of moisture.

A plurality of gate lines 121 is disposed on an upper surface of the insulation substrate 110. The gate lines 121 transmit gate signals, and may extend substantially in a horizontal direction. The gate lines 121 may extend not only to the display area (DA) of the thin film transistor array panel 300 but also to the peripheral area (PA) of the thin film transistor array panel 300, and they may include a plurality of gate electrodes 124 disposed in the display area (DA).

A gate insulating layer 140 made of, for example, a silicon nitride (SiNx) or a silicon oxide (SiOx) is disposed on the gate line 121.

A plurality of semiconductor layers 154 may be disposed on the gate insulating layer 140 of the display area (DA). Each of the semiconductor layers 154 is disposed on a corresponding gate electrode 124. The semiconductor layers 154 may be made of hydrogenated amorphous silicon, polysilicon, oxide semiconductor, or the like.

A pair of ohmic contact members 163 and 165 may be disposed on each of the semiconductor layers 154. The ohmic contact members 163 and 165 may be formed of a material such as n+ hydrogenated amorphous silicon, in which an n-type impurity such as phosphorus is doped at a high concentration, or silicide. Alternatively, the ohmic contact members 163, 165 may be omitted.

A plurality of data lines 171 are disposed on the ohmic contact members 163 and 165, and the gate insulating layers 140. The data lines 171 are disposed in the display area (DA). Further, a plurality of drain electrodes 175 of the display area (DA) may be disposed on the ohmic contact members 163 and 165, and the gate insulating layer 140.

The data lines 171 substantially extend in a vertical direction to cross the gate lines 121. Each of the data lines 171 may include a source electrode 173 extending toward the gate electrode 124.

The drain electrode 175 may face the source electrode 173 over the gate electrode 124.

The gate electrode 124, the source electrode 173, and the drain electrode 175 may collectively form a thin film transistor Q in one pixel area PX, together with the semiconductor 154.

A passivation layer 180 is disposed on the data line 171. The passivation layer 180 may be made of a material such as an inorganic insulation material or an organic insulation material.

The passivation layer 180 includes a contact hole 185 exposing the drain electrode 175.

A plurality of pixel electrodes 191 is disposed on the passivation layer 180.

Each pixel electrode 191 is physically and electrically connected to a corresponding drain electrode 175 through the corresponding contact hole 185, so as to receive a data voltage from that drain electrode 175.

The pixel electrodes 191 may be made of a transparent conductive material such as ITO or IZO, or a reflective metal such as aluminum, silver, chromium, or an alloy thereof.

In the display area (DA), a thin film transistor Q and the pixel electrode 191 connected thereto may form one pixel area PX.

The pixel area PX of the thin film transistor array panel 300 may be divided into a plurality of openings OA that light of the pixel transmits through, and a light blocking area BA that prevents light leakage between the openings OA. In this case, the thin film transistor array panel 300 may include a light blocking member (not shown) disposed to differentiate the opening OA and the light blocking area BA. The light blocking member is referred to as a black matrix, and it prevents light leakage between pixels. The signal lines such as the gate lines (GL1, GL2, GL3, and so on), the data lines (DL1, DL2, DL3, and so on), and the like, and at least some of the switching elements disposed in the pixel area PX, may be covered by the light blocking member of the pixel area PX.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Furthermore, different features of the various embodiments, disclosed or otherwise understood, can be mixed and matched in any manner to produce further embodiments within the scope of the invention.

| <Description of symbols> | |
|---|---|
| 110: insulation substrate | 111: concavity |
| 112: bottom surface | 113: lateral surface |
| 121: gate line | 124: gate electrode |
| 140: gate insulating layer | 154: semiconductor |
| 171: data line | 173: source electrode |
| 175: drain electrode | 180: passivation layer |
| 185: contact hole | 191: pixel electrode |
| 300: thin film transistor array panel | |
| DA: display area | PA: peripheral area |
| OA: opening | Q: switching element |
| PX: pixel area | |

What is claimed is:

1. A thin film transistor array panel, comprising:
an insulation substrate including an upper surface and a lower surface;
a light blocking member disposed on or facing the upper surface of the insulation substrate and defining a plurality of openings; and
a thin film transistor disposed on the upper surface of the insulation substrate,
wherein the insulation substrate includes a plurality of recesses formed in the lower surface of the insulation substrate, each recess positioned to correspond to one of the openings.

2. The thin film transistor array panel of claim 1, wherein each recess includes opposing lateral surfaces and a bottom surface extending therebetween.

3. The thin film transistor array panel of claim 2, wherein at least one lateral surface is substantially perpendicular to its corresponding bottom surface.

4. The thin film transistor array panel of claim 2, wherein at least one lateral surface forms an angle of about 105° to 150° with respect to its corresponding bottom surface.

5. The thin film transistor array panel of claim 1, wherein a cross-sectional shape of each recess is an arc, sine wave, semicircular, or semi-elliptical shape.

6. The thin film transistor array panel of claim 1, wherein the insulation substrate comprises at least one of polyimide, polyamide, and polycarbonate.

7. The thin film transistor array panel of claim 1, wherein a thickness of the insulation substrate is from about 2 μm to about 50 μm.

8. The thin film transistor array panel of claim 7, wherein a height of each recess is equal to or less than ⅔ of the thickness of the insulation substrate.

9. The thin film transistor array panel of claim 1, further comprising
a passivation film formed below the lower surface of the insulation substrate.

10. The thin film transistor array panel of claim 1, wherein the thin film transistor includes:
a gate electrode;
a gate insulating layer formed on the gate electrode;
a semiconductor layer formed on the gate insulating layer;
a pair of ohmic contact members formed on the semiconductor; and
a source electrode and a drain electrode formed on the ohmic contact members.

11. A display device comprising:
an insulation substrate including an upper surface and a lower surface;
a light blocking member disposed on or facing the upper surface of the insulation substrate and defining a plurality of openings;
a thin film transistor disposed on the upper surface of the insulation substrate; and
a plurality of color filters formed in the openings,
wherein the insulation substrate includes a plurality of recesses formed in the lower surface of the insulation substrate, each recess positioned to correspond to one of the openings.

12. The display device of claim 11, wherein
each recess includes opposing lateral surfaces and a bottom surface extending therebetween.

13. The display device of claim 12, wherein
at least one lateral surface is substantially perpendicular to its corresponding bottom surface.

14. The display device of claim 12, wherein
at least one lateral surface forms an angle of about 105° to 150° with respect to its corresponding bottom surface.

15. The display device of claim 11, wherein
a cross-sectional shape of each recess is an arc, sine wave, semicircular, or semi-elliptical shape.

16. The display device of claim 11, wherein
the insulation substrate comprises at least one of polyimide, polyamide, and polycarbonate.

17. The display device of claim 11, wherein
a thickness of the insulation substrate is from about 2 μm to about 50 μm.

18. The display device of claim 17, wherein
a height of each recess is equal to or less than ⅔ of the thickness of the insulation substrate.

19. The display device of claim 11, further comprising
a passivation film formed below the lower surface of the insulation substrate.

* * * * *